United States Patent
Eshelman et al.

(10) Patent No.: US 6,487,544 B1
(45) Date of Patent: Nov. 26, 2002

(54) METHOD FOR OPTIMIZING A LINE OF PICK AND PLACE MACHINES

(75) Inventors: Larry J. Eshelman, Ossining, NY (US); J. David Schaffer, Wappingers Fall, NY (US)

(73) Assignee: Koninlijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/286,026

(22) Filed: Apr. 5, 1999

(51) Int. Cl.[7] .............................................. G06F 15/18
(52) U.S. Cl. ......................................... 706/13; 706/62
(58) Field of Search ..................... 706/13, 62; 382/173, 382/308

(56) References Cited

U.S. PATENT DOCUMENTS

| | | | | |
|---|---|---|---|---|
| 4,697,242 A | * | 9/1987 | Holland et al. ............... | 706/13 |
| 4,821,333 A | * | 4/1989 | Gillies ......................... | 382/308 |
| 4,935,877 A | * | 6/1990 | Koza ........................... | 706/13 |
| 5,048,095 A | * | 9/1991 | Koza et al. .................. | 382/173 |
| 5,136,686 A | * | 8/1992 | Koza ........................... | 706/13 |
| 5,148,513 A | * | 9/1992 | Koza et al. ................... | 706/13 |
| 5,222,192 A | * | 6/1993 | Shaefer ........................ | 706/13 |
| 5,255,345 A | * | 10/1993 | Shaefer ........................ | 706/13 |
| 5,343,554 A | * | 8/1994 | Koza et al. ................... | 706/13 |
| 5,390,282 A | * | 2/1995 | Koza et al. ................... | 706/13 |
| 5,390,283 A | * | 2/1995 | Eshelman et al. ............ | 706/13 |
| 5,864,833 A | * | 1/1999 | Schaffer et al. .............. | 706/13 |

FOREIGN PATENT DOCUMENTS

| | | | | |
|---|---|---|---|---|
| JP | 09097246 A | | 8/1997 | ........... G06F/15/18 |
| JP | 10209681 A | | 7/1998 | ........... H05K/13/04 |

OTHER PUBLICATIONS

Combinations of genetic algorithms and neural networks: a survey of the state of the art, Schaffer, J.D.; Whitley, D.; Eshelman, L.J. Combinations of Genetic Algorithms and Neural Networks, 1992., COGANN–92. International Workshop (1992) pps. 1–37.*

* cited by examiner

Primary Examiner—Thomas Black
Assistant Examiner—Michael B. Holmes
(74) Attorney, Agent, or Firm—Aaron Waxler

(57) ABSTRACT

A genetic algorithm is used to balance a line of pick and place machines. The genetic algorithm uses a modularized chromosome string having at least three parts indicating 1) a division of parts between the pick and place machines, 2) a layout of a first pick and place machine, and 3) a layout of a second pick and place machine, respectively. A heuristic layout generator cycles with the genetic algorithm to create simulated layouts from populations of chromosome strings produced by the genetic algorithm. The heuristic layout generator is also modularized, having separate modules corresponding to the three parts of the chromosome string.

16 Claims, 3 Drawing Sheets

METHOD FOR OPTIMIZING A LINE OF PICK AND PLACE MACHINES

BACKGROUND OF THE INVENTION

1. Field of the Invention

The invention relates to the field of configuring lines of complex industrial robots, especially the so-called pick and place machines, using incomplete search techniques.

2. Related Art

The invention is an improvement on U.S. Pat. No. 5,390,283 ("283") and U.S. Pat. No. 5,864,833 ("833"), both of which are incorporated herein by reference.

Multiple head pick and place machines present a nearly intractable combinatorial problem, because there are so many layout options—what with multiple pickup nozzles, pipette modules, gripper types, feeders, trays, and so forth. It is desirable to choose the proper combination of options, so that part placement is conducted as quickly as possible, but searching all the options is impractical. Accordingly, an incomplete search of the space of layouts is undertaken.

'283 teaches creating a layout, a.k.a. configuration, for a single pick and place machine using an incomplete search technique known as a genetic algorithm ("GA") in combination with a heuristic layout generator ("HLG") to generate the layout. A form of GA known as CHC is preferred. The GA uses a population of chromosome strings, each containing genes that influence the HLG. The GA crosses over and mutates the population, and causes elimination of unfit individuals, in a simulation of the biological process of evolution. The HLG attempts to translate each chromosome string into an actual layout and then evaluates how good that layout or partial layout is. The quality assessment by the HLG is used in each subsequent iteration of the GA to determine which chromosome strings live or die.

The GA is a technique that generally requires a great deal of experimentation to apply to a particular problem. A chromosome string format representing a problem solution needs to be developed. Then the format must be tested by multiple applications of the GA, testing the results each time, to see if the format repeatedly results in convergence towards an improved solution. Typically several string formats must be tested prior to selection of a preferred one. It is not usually possible to predict what format will work for a given problem, especially if that problem is not simple.

'833 refines the techniques of '283 for lines of at least two pick and place machines of different types. '833 adopts a chromosome string which represents a unified layout for the entire line and then uses a GA and an HLG to find layout solutions for the line. '833's preferred embodiment shows a line of two machines of different types, a Philips FCM and a Philips ACM.

SUMMARY OF THE INVENTION

The object of the present invention is to improve the techniques of '833.

This object is achieved by modularizing the chromosome string and the HLG. In particular, the allocation of part types to machine types is carried out in a separate step from the rest of the layout generation.

DETAILED DESCRIPTION OF THE PREFERRED EMBODIMENTS

Figure 1:
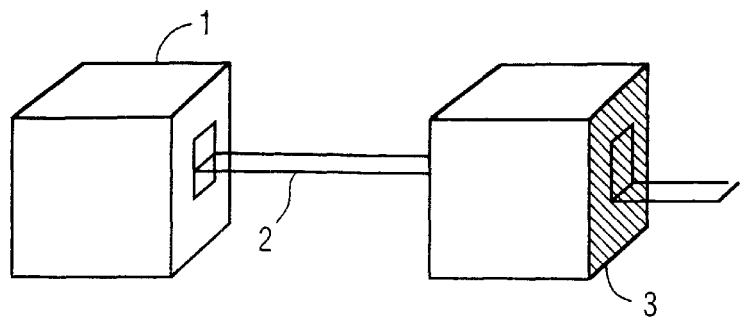
FIG. 1 shows a line of pick and place machines

FIG. 1 shows a manufacturing line including two pick and place machines 1, 3. Printed circuit boards, not shown, pass through the line on the conveyor 2. As with '833, the two pick and place machines can be an ACM and an FCM. Though the figure shows only two machines, the invention is applicable to lines of more machines.

Figure 2:
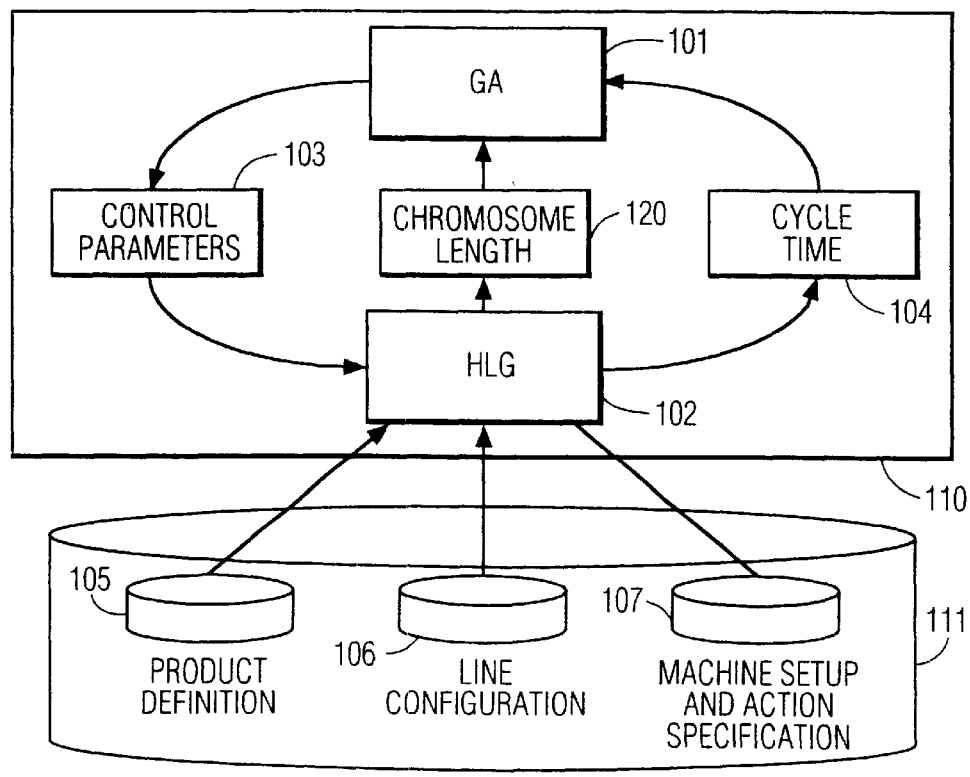
FIG. 2 shows a schematic of the method according to the invention

FIG. 2 shows a schematic of the method according to the invention. Within a processor 110, a GA 101 interacts iteratively with HLG 102. The processor 110 can be either internal or external to the machines 1,3.

The GA 101 maintains a population of chromosome strings, not shown. The length of the chromosome strings 120 is supplied to the GA 101 by the HLG 102, during an initialization step. In response to that length, the GA 101 creates the first population of strings. In later iterations, the GA 101 applies mutation and/or crossover, in accordance with whatever type of GA 101 is chosen. As in the incorporated patents, CHC is the preferred type, though other types might equally well be used. The GA 101 then supplies chromosome strings as control parameters 103 to the HLG 102.

The HLG 102 interacts with files defining the product to be manufactured 105, line configuration 106, and machine setup and specification 107, stored within a memory device 111. The HLG then supplies measures of fitness 104, associated with the chromosome strings 103. These measures might be some cost functions such as cycle times. The GA uses these measures of fitness in later iterations.

The cycle shown in FIG. 2 repeats until some criterion of termination is reached.

Overview of the HLG

Figure 3:
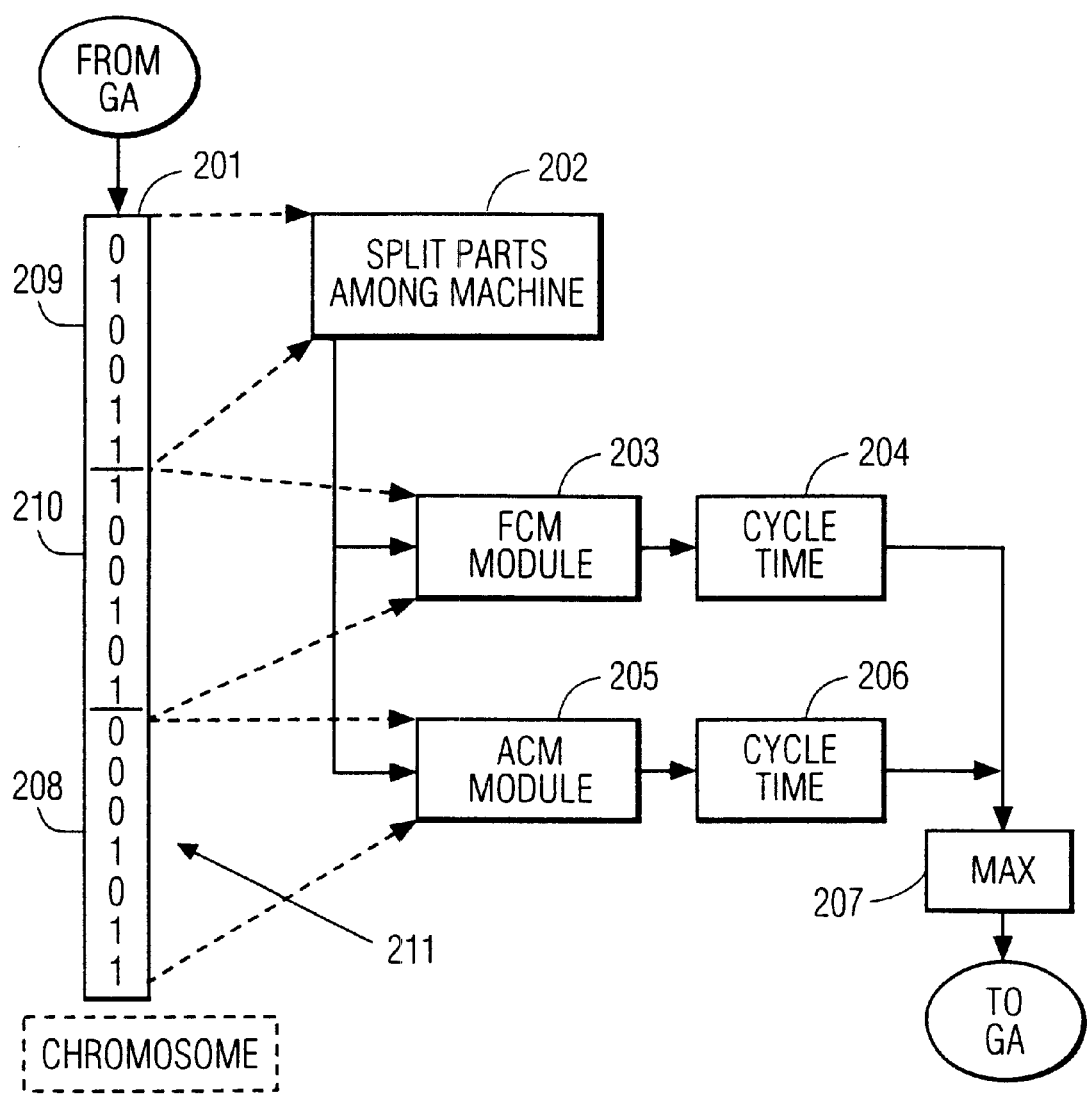
FIG. 3 shows a more detailed schematic of the HLG

FIG. 3 shows the action of the HLG 102 in accordance with the invention, after initialization is complete. From GA 101, the HLG receives a chromosome string 211. Only one string is shown in this figure, but in reality the HLG must act on each string generated by the GA. A first portion of the chromosome string 209 represents parameters controlling how parts are to be split among the machines 1, 3. A second portion of the chromosome string 210 represents parameters controlling layout of the first machine 1, in this case a Philips FCM. A third portion of the chromosome string 208 represents parameters controlling layout of the second machine 3, in this case a Philips ACM. Typically there will be a fourth part of the chromosome, not shown, which includes some genes used by both modules 203 and 205. The chromosome string here is shown schematically as having a fairly small number of bits. In fact, the real chromosome string is much longer, e.g. 100–4000 bits. Although this example is given in terms of two particular pick and place machines, the method in accordance with the invention may equally well be adapted to lines with other machines by those of ordinary skill in the art.

Within the HLG 102, first a splitter module 202 works under control of the first portion of the chromosome string 209 to produce a parts allocation between machine 1 and machine 3. Then two modules 203, 205 generate layouts for machines 1, 3, respectively. Modules 203 and 205 operate in accordance with the principles of '283 and '833. On the one hand, they may be written as separate HLG modules for machines 1 and 3, per '283. Alternatively, a line type module, per '833, may be told that it is dealing with a line of one machine type. Although this example shows only one machine of each type, as taught by '283, each module 203 and 205 can actually optimize a line of several machines, so long as those machines are of the same type. Modules 203 and 205 perform tasks of the following sorts:

- assigning grippers to pipette modules ("PM") (or to tool (or nozzle) exchange units on the ACM);
- assigning feeder bars to pipette modules (or bar piers for the ACM);
- assigning feeder types to feeder bar slots (or trays and pallets to slots in tray stackers);
- assigning part types to pick positions;
- assigning individual parts to specific PM-index steps (FCM) or parts to charges (ACM);
- sequencing the placement of the individual parts on each PM during each index step FCM); and
- sequencing BVM (Board Vision Module) imaging, if BVM is present.

After modules 203 and 205 generate layouts, modules 204 and 206 determine cycle time measures of fitness for those layouts. Modules 204 and 206 are also in accordance with '283 and '833. Then module 207 determines a maximum cycle time for the entire line from the component cycle times produced at 204 and 206. Although this example is worked with only two pick and place machines, the method might equally well be extended to more machines.

Indeed the modularity of the method in accordance with the invention is particularly well adapted to the addition of new machine types, since the entire chromosome does not have to be redesigned for each machine type added. Only new segments need to be added for new modules.

In the HLG 102, none of the modules need to be modified with the addition of new machine types. New modules analogous to 203–206, need to be added at the bottom of the figure for the additional machines.

Also, if one of the machines is modified, only the modules and chromosome portions relating to that machine need to be changed.

Box 207 outputs the measure of fitness to the GA101, which iterates to the next step. The output can be in the form of a cost vector having three positions where:

- Cost[0] is a fail code, which is the highest one encountered for any machine type in the line, the code will have one of two values as follows:
  - 0=no failure
  - 1=a layout failure in some machine type module
- Cost [1] is the cycle time for the slowest machine in the production line. If cost[0]=1, then cost [1] is the number of parts that could not be placed
- Cost[2] the total number of pick positions used This 3-part cost vector is used hierarchically by the GA. That is, when comparing two chromosomes, the better chromosome is the one with the lower cost, where comparing starts at level 0 and proceeds to the next level only if there is a tie. An infeasible layout from any machine type module 204, 206 will have a cost[0] of one. If both chromosomes yield infeasible layouts, the one with the fewest parts not placed is better. If both chromosomes represent feasible solutions, the cycle times, cost[1] are compared; and, if these are equal, the number of pick positions (roughly equivalent to the number feeders required) is used to break ties. If all three scores are equal, the chromosomes are considered equally fit. This scheme allows the GA 101 to make progress solving very difficult problems where feasible solutions are hard to discover, and to prefer solutions that require less hardware when cycle times are equal.

When iteration between boxes 101 and 102 appears to be converging on a reasonable solution, boxes 203 and 205 can output the final layout to be used on the machines 1 and 3.

The preferred cycle of FIG. 2, in combination with the modularized HLG of FIG. 3, is not precisely a divide and conquer approach. The divide and conquer approach would have completely separate optimizations for the various machines after the parts were divided between machines. The preferred embodiment is a hybrid between the monolithic method of '833 and the divide and conquer approach. In the preferred embodiment, the allocation of parts to machines and the layout of the individual machines are optimized together, just as in the monolithic approach.

In FIG. 3, the order of the chromosome segments 209, 210, 208 is optional. The same function can be achieved with these segments in any order.

Initialization

In the initialization step, the HLG establishes a chromosome length for the GA. With respect to parts 208 and 210 of the string, this is in accordance with '833 and '283. However, the preferred chromosome length for the portion 209, will now be described. Parts which can go on only one machine will be assigned there without gene control. The chromosome length for parts that can go on more than one machine type is determined by the following pseudo code, also illustrated in FIG. 4: The numerals in parentheses in the Chromosome Format refer to FIG. 4. In this embodiment, the chromosome is a bit string.

CHROMOSOME FORMAT

If there is a single fastest machine type for any part type group ("ptype_group"), then 1 bit for
use_fast_default_heuristic (P3 below) (401)
for each ptype_group
1 bit for direct assignment (402)
$n_1$ bits for machine_type_order (403)
($n_1$ to be determined by heuristic P2 explained below)
for each machine type with which this group can be placed,
$n_2$ bits (404,408) for seq_ctl
$n_3$ bits (405, 409) for sequence count
$n_4$ bits (406,410) for part_type_assign
if there are two or more machines of the same speed (fast/slow) for this ptype_group,
then 1 bit for reverse_order (407, 411)
where
$n_1$ is the number of bits in machine_type_order
$n_2$ is the number of bits in seq_ctl. It is one for ptype_groups with more than 10 part_types, and zero otherwise (i.e., there is no gene). The number ten is chosen here as a heuristic.
$n_3$ is the number of bits in a gene to be used for sequence count. For ptype_groups with fewer than 10 part_types (a heuristic), $n_3$ is the number of part types, otherwise $n_3$ is the ceiling of half the number of part types.
$n_4$ is the number of part type assignment bits (406, 410). This variable is equal to the number of part types in the respective part type group. seq_ctl (404, 408) is a gene that influences sequence count (discussed below under Indirect Assignment).
part_type assign refers to the genes illustrated in FIG. 4 at 408 or 410. It is used in both direct and indirect assignment as explained below.

part_type is used interchangeably with the phrase "part type" to mean parts having the same manufacturer model number.

ptype_group is used interchangeably with the phrase "part type group". All of the part types within a part type group share the same package type and set of machine types to which they may be assigned.

direct assignment gene (1 bit, 402) is a gene determining whether direct or indirect assignment is used.

Machine_type_order (403) is an array that lists: the default machine type for the respective ptype_group (entry 0), the $1^{st}$ alternative machine type (entry 1), etc. This list is built under chromosome control using heuristic P2.

The use_fast_default_heuristic gene (401) is inserted into the chromosome only if there is a single fast machine type for at least one ptype_group.

sequence count is a gene used for indirect assignment as explained below;

reverse order, when present, is a gene used in indirect assignment as explained below.

P2 will now be described. The value of the variable $n_1$ must be enough to allow a unique code for every permutation of the applicable machine types. For two machine types, a single bit suffices to designate the default machine type; the only other machine type is the only alternative. For three machine types, one must first choose 1 of the 3 machine types to be the default (2 bits needed); and then the $1^{st}$ alternative involves choosing 1 of the remaining 2 (1 bit needed), so $n_1$ is 3 for 3 machine types. For four machine types, the first choice is one of four (2 bits); the $1^{st}$ alternative needs to chose 1 of the remaining 3 (2 bits); and the $2^{nd}$ alternative needs to chose 1 of the remaining 2 (1 bit); so $n_1$ is 5 for four machine types.

Figure 4:
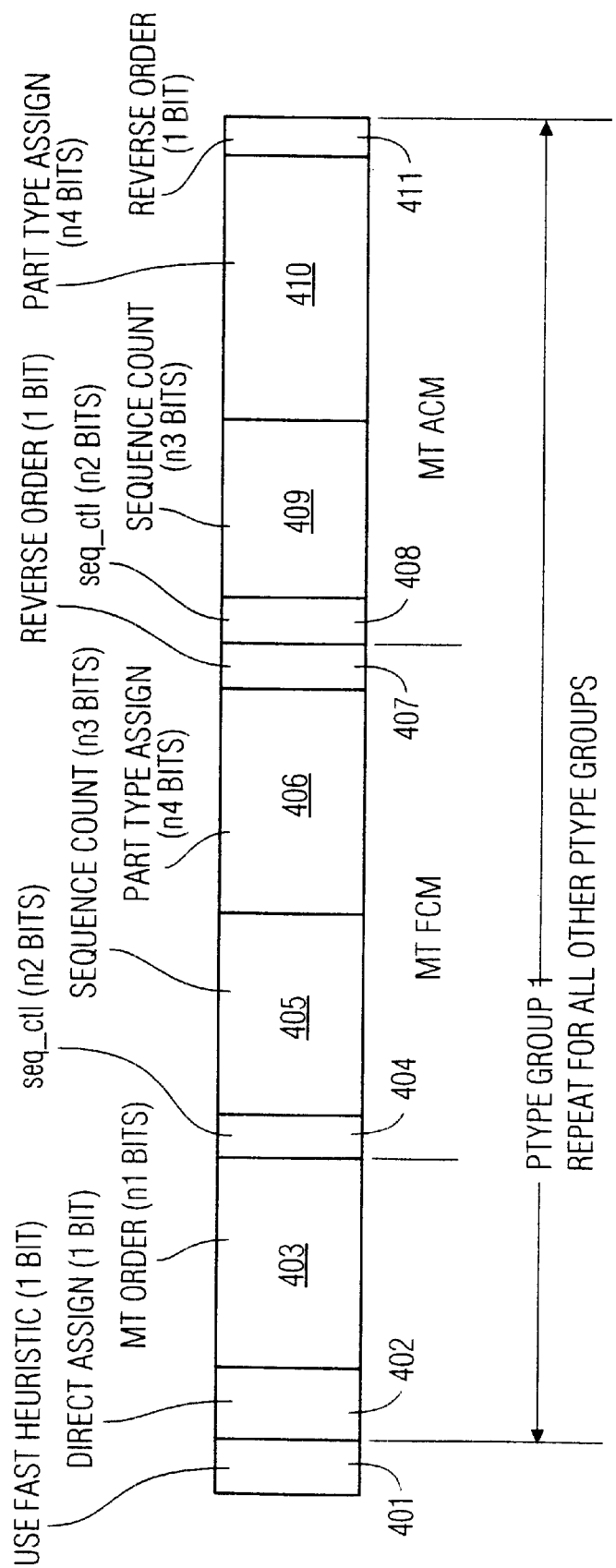
FIG. 4 shows a portion of a chromosome string.

FIG. 4 shows reverse order bits, 407 and 411, merely to show placement. In fact, with two machine types of different speeds, such as the FCM and ACM mentioned in the figure, the reverse order bit would not actually appear. This bit only appears if both machine types have the same speed. Thus if there were two fast machines and two slow machines, the chromosome would have four reverse order bits for each part type group that can go on all four machine types. If there were two fast machines and one slow machine, there would be two reverse order bits, for each part type group that could be placed on both fast machine types; but there would be no reverse order bits for the slow machine.

The format described above only appears for part type groups on which there is a choice of machine types. If there is no choice, then gene control is not used for part type assignment. Similarly, the segments seq_ctl, sequence count, part type assign, and reverse order are only present for those machine types which the group can be placed on.

The chromosome format listed above is a good deal more complex than the straightforward technique of merely assigning a machine type gene or genes to each part type. In particular, the format enables the following functions:

First considering the part types in groups,
For each group, giving a default machine type,
Altering the default machine type for individual part types This concept was found to give better results experimentally, by repeated applications of the GA and HLG, over the straightforward technique and is therefore preferred. The straightforward technique was found to be brittle, because even small changes in the chromosome string could take a workable solution and turn it into a significantly inferior solution.

Nevertheless, other chromosome formats might readily be devised by those of ordinary skill in the art in view of the teachings herein. For instance, a straightforward representation might work better, if a special mutation were designed which would pair changes so that if one assignment were changed another would be changed in the opposite direction. In general, in designing a chromosome string, soft control should be emphasized, so that single changes in genes do not cause a violent change in the result. One wants to apply heuristics that bias splitting in ways that seem to make sense most of the time, while giving the GA ability to override these for exceptional cases.

One might also design a chromosome that simply assigned part type groups to machines. However, this would gives fewer options for line balancing and is therefore considered less desirable than the preferred string listed above.

Other Initialization

In addition to specification of the chromosome format, and the resultant chromosome length, initialization within the HLG also includes setting up and initializing various variables and arrays. Again, most of this will be in accordance with '283 and '833, but a few of the items are particular to the allocation of parts to machines. These are preassigned_mt; pt_indexes[mt], and n_pre_ass[mt].

If there are preassignments, for a part type ("pt"), then the variable preassigned_mt[pt] indicates the machine type with the most preassignments. There is one such value for each part type ("pt") having a preassignment. If there are no preassignments for any part type, pt, the variable is empty for that part type. The use of this value will be described below.

The array pt_indexes[mt] contains a sorted list of part types for each machine type the respective part type group is allowed to use. In this list, part type numbers are assigned in descending order according to numbers of parts of that type to be placed on the product. In other words, the most numerous part type in a group will be assigned part type number 1, i.e. the first position in the array. The second most numerous part type in a group will be assigned part type number 2, i.e. the second position in the array, etc. For fast machine types, the part types are sorted in ascending order of number of parts. For slow machine types, this order is reversed. In cases of ties, the part_type with preassignments on the given machine type (If one, but not both) is sorted first.

The array n_pre_ass[mt] represents a number of part types in a part type group that have preassignments on machine type "mt".

A decision in the design of the part-splitter was that parts would generally not be assigned individually, but in sets. For most problems, allocating the set of all parts of one type to one machine type proves to be a good strategy. For a few PCBs, there are too few part types for this to be completely effective; the granularity of possible solutions is too coarse to find the good solutions. For these problems, we have observed that it is adequate if only a single part type is split at the level of the individual parts.

The routine create_type_groups( ) defines separate ptype_groups consisting of those part types that share the same package type and machine type set. Each part type presented in the input (105) is accompanied by a bit string flagging whether (1) or not(0) it may be placed on each machine type. Each unique pattern (bit string) defines a different machine type set. Every machine type known to the HLG is designated as either "fast" or "slow"—FCMs are fast and ACMs are slow.

The first step is to identify the one ptype_group that will consist of a single part_type whose individual parts may be split among machine types. There will always be a part_type that may be split even if the algorithm does not choose to split it. This part_type is the one with the most parts among those allowed to be placed on all machine types. In case there are ties, the first one encountered is selected. The order of encountering is the order the part_types are presented in the input (105). If no part_type is allowed to be placed on all machine types, then no part_type will be splittable.

Operation of the HLG

The following pseudo code describes the main procedure for the HLG, after initialization, with respect to part type assignment, for those part types which can run on more than one machine type:

decode_tp_split_chrom( )
   for each ptype_group
      if the direct assignment gene is on
         assign each part_type to the machine type directly (P1)
      else
         assign each part_type to the machine type indirectly (P4)

In the preferred embodiment there are three different ways of assigning part groups to machines. The first way is when a part type group can only be assigned to one machine type. Such part type groups are assigned without gene control. The second way is called direct assignment. In direct assignment, the part assignment genes directly control the assignment of parts. The third way is indirect assignment. This scheme was developed when it was learned that direct assignment had difficulty in some cases. It was sometimes difficult for the GA to learn the precise patterns needed for the assignment bits. Some method to soften the strictness of direct assignment was needed. The combined use of direct and indirect assignment in the preferred embodiment was derived through experimentation and found to derive better machine configurations than direct assignment alone.

Direct Assignment Within the HLG

The HLG assigns individual part_types to machines as follows.

The basic idea is that, first part_types are chosen for correspondence with the $n_4$ bits in accordance with the order established in pt_indexes[mt]. Within the part type group, assignment of individual part types to a machine begins by flagging all part types for the default machine type. Then, for each alternative machine type in turn, the $n_4$ part type assignment bits corresponding to that machine type are examined. If any part type's bit in the chromosome string is one, and that part type's flag in the HLG is the default, its flag in the HLG is changed to the current alternative machine type. Thus, once a part type is assigned to one alternative machine type, it will not be reassigned to a lower alternative.

Genes 404, 405, 408, and 409 are not used in direct assignment.

Indirect Assignment Within the HLG

However, indirect assignment is a bit more complex. The idea behind heuristic P4 is that since the GA is choosing the default machine type, generally one should limit the number of part_types assigned to the non-defaults. This is accomplished by first determining the maximum number of part types, for each alternative machine type, before examining the assignment bits. This determination should be done in a way that favors small numbers.

This maximum number is determined, in the preferred embodiment, by counting (left to right) the number of consecutive ones that occur in sequence count, halting at the first zero encountered. The count at halt is that maximum. Thus if the first bit is zero, no part types go on this alternative. The numbers resulting from this scheme tend to be small, but the GA can evolve longer sequences of ones if it needs to. To make the generation of larger numbers more likely for groups with a large number of part_types, a little softness is provided with the seq_ctl gene For family groups having fewer than 10 part types, this gene is not used; but, for larger groups, a single bit is provided. Thus $n_2$ is zero or one. If seq_ctl is on, the sequence counter will skip one zero and keep counting ones until the second zero is encountered.

Once the number of part types to assign to a non-default machine type is in hand, P4
   uses the part type assignment bits to decide which part types are going to get the non-default machine just as with direct assignment; but
   stops when the maximum number is reached.

As with direct assignment, once a part is assigned to one alternative machine type, it will not be reassigned to a lower alternative. The order established in pt_indexes[mt] has a strong influence here, since those at the head of the list are more likely to be selected for assignment to non-default machine types. The reverse gene adds more flexibility, by instructing P4 to chose the part types destined for the non-default from the tail rather than from the head of the list. Thus if the default machine is slow, more parts are likely to be assigned to the faster machine, and if the machine is fast, more parts are likely to be kept on the faster machine.

The part type group (if any) that contains a single part type that is to be split at the level of individual parts is to be treated with the same logic. In other words, in some cases multiple parts of the same type are to be placed on a board. In such a case, it might be desired that some of those parts be placed by one machine and some by another. In such a case the group is treated as before, but the individual parts are treated like the part types before. The assignment bits ($n_4$) now correspond to parts, and the part ordering is based on the ratio of their estimated part placement time for the ACM and FCM. The idea is that those parts at the head of each machine type's list should be those with the best speed advantage (or least speed disadvantage) on that machine type.

There is a slight modification to indirect assignment when the use_fast_default_heuristic gene is set. This modification is the heuristic P3. In P3, if:
   a) the use_fast_default_heuristic gene is set, i.e. takes on the value one;
   b) the given ptype_group is one with a single fastest machine type; and
   c) the number of part types in this part type group is greater than a heuristic threshold (preferably 4),
then the default machine type is set to the fast machine type. The remaining alternatives (if any) are filled in as above. Thus the use_fast_default_heuristic gene can short-circuit the machine type order genes.

The other circumstance in which the default machine type is forced rather than gene-controlled involves preassignments. If preassigned_mt indicates that more than half the part types in the part type group have been preassigned to one machine type, then that machine type is used as the default. This circumstance will override the use_fast_default_heuristic gene procedure if it had been applied.

With respect to the variable $n_1$, when using 2 bits to code for 1 of 3 alternatives, there is an extra code available, because two bits allow four patterns. The extra code is necessarily going to be invoked by the GA through random initialization, crossover, and mutation. Therefore the extra code must be given some meaning in the HLG. The extra code can be assigned to one of the legitimate alternatives in a hard-coded table. While this induces some bias in the initial sampling of machine type orders, the GA seems capable of overcoming it when needed.

Some Examples

Now some example of how the heuristic layout generator deals with a chromosome string will be discussed. These examples will deal with a single part type group. We will assume that the line has an FCM and an ACM and that this part type group can go on either the FCM or the ACM. The FCM is fast and the ACM is slow. All of the parts in this group will have a same package type, which we will call 0402. Then the list of part types computed by pt_indexes [mt] for the ACM, which is a slow machine, will look as follows:

| Package | Part type | Number of parts of this type |
|---------|-----------|------------------------------|
| 0402 | 1 | 8 |
| 0402 | 2 | 4 |
| 0402 | 3 | 2 |
| 0402 | 4 | 1 |
| 0402 | 5 | 1 | for the FCM, which is a fast machine, the list would look like this:

| Package | Part type | Number of parts of this type |
|---------|-----------|------------------------------|
| 0402 | 5 | 1 |
| 0402 | 4 | 1 |
| 0402 | 3 | 2 |
| 0402 | 2 | 4 |
| 0402 | 1 | 8 |

Given this information, the HLG, as part of initialization, will compute the following values $n_1$=1 bit (2 machine types)
$n_2$=0 bits (only 5 part types in this group)
$n_3$=5 bits (5 part types in group,2 machines)
$n_4$=5 bits (5 part types in group)

Example 1

Now suppose the direct assign bit is "1"

the machine type order bit is also "1", meaning the ACM is the default machine the part assignment bits (410) are 10101. The HLG looks at 410, rather than 406, because ACM is the default for this part type The part type assign bits 1, 0, 1, 0, 1 will be assigned to part types 1, 2, 3, 4, and 5, respectively. Thus the parts will be assigned as follows

| Part type | Default? | Machine type |
|-----------|----------|--------------|
| 5 | No | FCM |
| 4 | Yes | ACM |
| 3 | No | FCM |
| 2 | Yes | ACM |
| 1 | No | FCM |

Example 2

Now suppose the direct assignment bit is "0"(meaning indirect assignment)

the machine type order bit is "1"(meaning ACM is default)

the sequence count bits (409) are 11011

Counting one and stopping at the first 0, we must assign two part types to the non-default machine type. Consulting the part type assign bits, we would assign only part types 1 and 3 to the FCM and the rest to the ACM (default)

In the examples, if the use_fast_default_heuristic gene is on, then the FCM is made the default, rather than the ACM, because the FCM is faster. Then the part type assignment bits in 406 are used instead of the bits in 410.

We claim:

1. A method for configuring a line of manufacturing equipment, which line comprises at least first and second machines, the method comprising executing the following in a digital data processing device:
   a. supplying a population of strings;
   b. generating at least one simulated configuration based on the population, using a heuristic layout generator, which heuristic layout generator comprises:
      i. at least one first module for supplying a simulated allocation of parts between the first and second machines;
      ii. at least one second module for supplying a first simulated configuration of the first machine; and
      iii. at least one third module for supplying a second simulated configuration of the second machine;
   c. evaluating the at least one simulated configuration;
   d. supplying an evaluation result;
   e. applying a genetic algorithm to the population in response to the result;
   f. repeating steps c. through e. until the result reaches a criterion;
   g. supplying a configuration based on the population at the time the result reaches the criterion.

2. The method of claim 1 wherein each string in the population has a same format, which format comprises, not necessarily in the following order:
   a first portion for influencing the allocation;
   a second portion for influencing the first simulated configuration; and
   a third portion for influencing the second simulated configuration.

3. The method of claim 1 wherein the format enables:
   a. consideration of the parts in a plurality of groups;
   b. an assignment of default machine types to the groups; and c. an alteration of assigned machine type for individual parts or part types within each group.

4. The method of claim 3 wherein the generating comprises ignoring the alteration for at least one part type.

5. The method of claim 1 wherein the format allows specification of a default machine for at least one part type group and a number of part types to be assigned to that default machine.

6. The method of claim 5 wherein the heuristic layout generator ignores the specification with respect to at least one part type.

7. The method of claim 1 wherein the first and second machines are of different types.

8. A manufacturing line comprising at least a first and second machine, configured in accordance with the method of claim 1.

9. A computer readable medium embodying software for configuring a line of manufacturing equipment, which line comprises at least first and second machines, the embodiment comprising code for performing the method of claim 1.

10. A computer readable medium embodying software for configuring a line of manufacturing equipment, which line comprises at least first and second machines, the embodiment comprising code for performing the method of claim 2.

11. A computer readable medium embodying software for configuring a line of manufacturing equipment, which line comprises at least first and second machines, the embodiment comprising code for performing the method of claim 3.

12. A computer readable medium embodying software for configuring a line of manufacturing equipment, which line comprises at least first and second machines, the embodiment comprising code for performing the method of claim 4.

13. A computer readable medium embodying software for configuring a line of manufacturing equipment, which line comprises at least first and second machines, the embodiment comprising code for performing the method of claim 5.

14. A computer readable medium embodying software for configuring a line of manufacturing equipment, which line comprises at least first and second machines, the embodiment comprising code for performing the method of claim 6.

15. A computer readable medium embodying software for configuring a line of manufacturing equipment, which line comprises at least first and second machines, the embodiment comprising code for performing the method of claim 7.

16. A digital data processing device comprising a processor and the medium of claim 8.

* * * * *